US007482727B2

(12) United States Patent
Bratkovski et al.

(10) Patent No.: US 7,482,727 B2
(45) Date of Patent: Jan. 27, 2009

(54) COMPOSITE MATERIAL WITH CONDUCTIVE NANOWIRES

(75) Inventors: Alexandre Bratkovski, Palo Alto, CA (US); Shih-Yuan Wang, Palo Alto, CA (US); Ekaterina V. Ponizovskaya, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/580,641

(22) Filed: Oct. 13, 2006

(65) Prior Publication Data

US 2008/0102319 A1    May 1, 2008

(51) Int. Cl.
*H01L 21/84* (2006.01)

(52) U.S. Cl. .................. 310/300; 257/296; 438/551; 438/584

(58) Field of Classification Search ............... 310/300; 257/296; 438/551, 584
See application file for complete search history.

(56) References Cited

U.S. PATENT DOCUMENTS

| 6,977,767 | B2 | 12/2005 | Sarychev et al. | |
|---|---|---|---|---|
| 2003/0042487 | A1* | 3/2003 | Sarychev et al. | 257/53 |
| 2004/0082178 | A1 | 4/2004 | Kamins et al. | |
| 2005/0221128 | A1 | 10/2005 | Kochergin | |
| 2006/0044212 | A1 | 3/2006 | Wang et al. | |
| 2006/0131695 | A1* | 6/2006 | Kuekes et al. | 257/618 |
| 2006/0169788 | A1* | 8/2006 | Empedocles et al. | 235/492 |
| 2006/0211183 | A1* | 9/2006 | Duan et al. | 438/149 |
| 2006/0240681 | A1* | 10/2006 | Williams et al. | 438/800 |
| 2007/0281156 | A1* | 12/2007 | Lieber et al. | 428/373 |

FOREIGN PATENT DOCUMENTS

CN          1979705    *  6/2007

OTHER PUBLICATIONS

Panina, L., et al., "Optomagnetic composite medium with conducting nanoelements," Physical Review B 66, 155411, American Physical Society, pp. 1-17 (2002).
Podolskiy, V., et al., "Plasmon modes in metal nanowires and left-handed materials," Journal Nonlinear Opt. Phys. Materials, vol. 11, No. 1, pp. 65-74 (2002).
Podolskiy, V., et al., "Plasmon modes and negative refraction in metal nanowire composites," Optics Express, vol. 11, No. 7, pp. 735-745 (2003).
Podolskiy, V., et al., "Resonant light interaction with plasmonic nanowire systems," J. Opt. A: Pure Appl. Opt. 7, pp. S32-S37 (2005).
Grigorenko, A., et al., "Nanofabricated media with negative permeability at visible frequencies," Nature, vol. 438, Nov. 17, pp. 335-338 (2005).

* cited by examiner

*Primary Examiner*—Thomas M Dougherty (57) ABSTRACT

A composite material exhibiting at least one of a negative effective permittivity and a negative effective permeability for incident radiation at an operating wavelength is described. The composite material comprises a dielectric layer generally parallel to a dielectric layer plane, and further comprises a first plurality of nanowire pairs disposed in the dielectric layer. Each of the first plurality of nanowire pairs comprises substantially parallel conductive nanowires of short length and separation relative to the operating wavelength. Each of the first plurality of nanowire pairs is substantially coplanar with a first plane substantially parallel to the dielectric layer plane.

23 Claims, 7 Drawing Sheets

FIG. 9-2

COMPOSITE MATERIAL WITH CONDUCTIVE NANOWIRES

STATEMENT REGARDING FEDERALLY SPONSORED RESEARCH OR DEVELOPMENT

This invention was made with Government support under Agreement No. HR0011-05-3-0002, awarded by DARPA. The Government has certain rights in the invention.

FIELD

This patent specification relates generally to the propagation of electromagnetic radiation and, more particularly, to composite materials capable of exhibiting negative effective permeability and/or negative effective permittivity with respect to incident electromagnetic radiation.

BACKGROUND

Substantial attention has been directed in recent years toward composite materials capable of exhibiting negative effective permeability and/or negative effective permittivity with respect to incident electromagnetic radiation. Such materials, often interchangeably termed artificial materials or metamaterials, generally comprise periodic arrays of electromagnetically resonant cells that are of substantially small dimension (e.g., 20% or less) compared to the wavelength of the incident radiation. Although the individual response of any particular cell to an incident wavefront can be quite complicated, the aggregate response the resonant cells can be described macroscopically, as if the composite material were a continuous material, except that the permeability term is replaced by an effective permeability and the permittivity term is replaced by an effective permittivity. However, unlike continuous materials, the resonant cells have structures that can be manipulated to vary their magnetic and electrical properties, such that different ranges of effective permeability and/or effective permittivity can be achieved across various useful radiation wavelengths.

Of particular appeal are so-called negative index materials, often interchangeably termed left-handed materials or negatively refractive materials, in which the effective permeability and effective permittivity are simultaneously negative for one or more wavelengths depending on the size, structure, and arrangement of the resonant cells. Potential industrial applicabilities for negative-index materials include so-called superlenses having the ability to image far below the diffraction limit to $\lambda/6$ and beyond, new designs for airborne radar, high resolution nuclear magnetic resonance (NMR) systems for medical imaging, microwave lenses, and other radiation processing devices.

One issue that arises in the realization of useful devices from such composite materials, including negative index materials, relates to isotropy of response. For many practical devices, it is desirable that radiation incident at different angles and having different polarizations "see" the same characteristics. Another issue relates to the ability to fabricate such composite materials at a small enough scale for such negative effective permeability and/or negative effective permittivity behaviors to be exhibited in the visible wavelength regime. Yet another issue relates to attenuation of the radiation as it propagates through such composite materials, such attenuation having been observed as being relatively high in many cases.

Still another issue that arises relates to a device's amenability to large-scale, en masse fabrication techniques, particularly large-scale lithographic techniques, for increasing device availability and/or reducing device costs. It would be desirable to provide for negative effective permeability and/or negative effective permittivity behaviors in a composite material in a manner that avoids, addresses, and/or improves upon one of more of the above-described issues. Other issues arise as would be apparent to one skilled in the art in view of the present disclosure.

SUMMARY

In one embodiment, a composite material exhibiting at least one of a negative effective permittivity and a negative effective permeability for incident radiation at an operating wavelength is provided, comprising a dielectric layer generally parallel to a dielectric layer plane, and further comprising a first plurality of nanowire pairs disposed in the dielectric layer. Each of the first plurality of nanowire pairs comprises substantially parallel conductive nanowires of short length and separation relative to the operating wavelength. Each of the first plurality of nanowire pairs is substantially coplanar with a first plane substantially parallel to the dielectric layer plane.

Also provided is a composite material exhibiting at least one of a negative effective permittivity and a negative effective permeability for incident radiation at an operating wavelength, comprising a first dielectric layer generally parallel to a first plane, and further comprising a first plurality of nanowires distributed across the first dielectric layer. Each of the first plurality of nanowires is generally normal to the first plane and is of short length relative to the operating wavelength. Each of the first plurality of nanowires comprises a columnar core including an optically pumped gain material and a semi-cylindrical metal layer coated on one side of the core. Advantageously, the semi-cylindrical metal layer provides longitudinal conductivity while a non-coated side of the core provides for access to the gain material by externally applied optical pump light.

Also provided is a method for fabricating a composite material having at least one of a negative effective permittivity and a negative effective permeability for incident radiation at an operating wavelength. A first layer is formed comprising a first dielectric material and a plurality of conductive vertical parallel nanowire pairs of short length and separation distance relative to the operating wavelength. A second layer is formed comprising a second dielectric material and a plurality of conductive horizontal parallel nanowire pairs of short length and separation distance relative to the operating wavelength. The plurality of conductive horizontal parallel nanowire pairs are substantially coplanar and separated from the plurality of conductive vertical parallel nanowire pairs in the first layer by a distance substantially less than the operating wavelength.

BRIEF DESCRIPTION OF THE DRAWINGS

FIG. 9 illustrates fabrication of a composite material according to an embodiment.

DETAILED DESCRIPTION

Figure 1A:
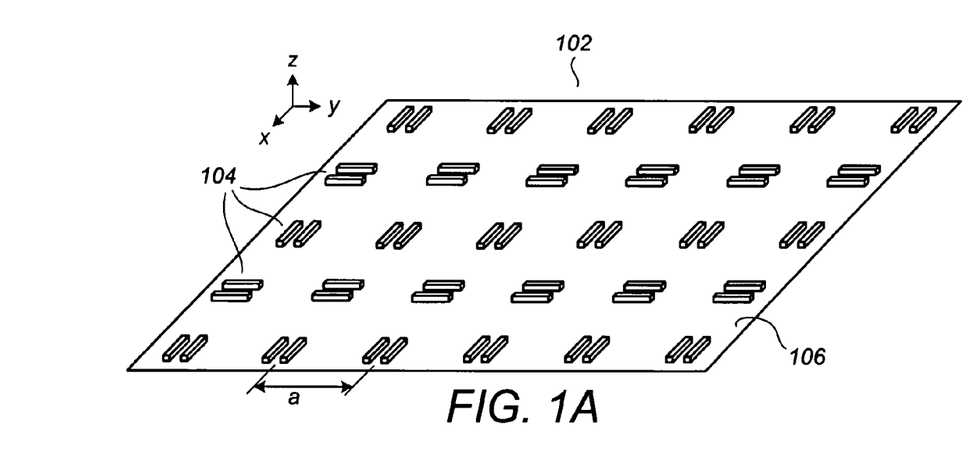
FIG. 1A illustrates a perspective view of a composite material according to an embodiment.
Figure 1B:
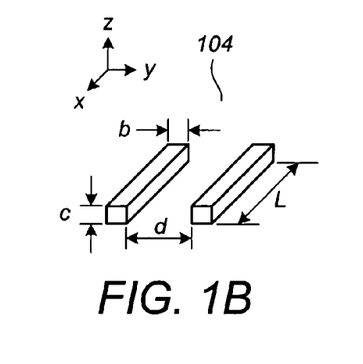
FIG. 1B illustrates a perspective view of a conductive parallel nanowire pair of the composite material of FIG. 1A.

FIG. 1A illustrates a perspective view of a composite material 102 according to an embodiment, comprising a plurality of nanowire pairs 104 disposed in a dielectric layer of material. For purposes of clarity, the dielectric layer of material is not explicitly drawn in FIG. 1A but should be understood as being a generally slab-like or sheet-like material layer that either encompasses a plane 106 of the nanowire pairs 104 or supports the nanowire pairs 104 from directly underneath the plane 106. FIG. 1B illustrates a closer perspective view of one of the nanowire pairs 104. According to an embodiment, the nanowire pairs 104 comprise substantially parallel conductive nanowires having a length "L" and a separation distance "d" that are each small compared to an operating wavelength for which the at least one of the negative effective permeability and negative effective permittivity are desired. For one embodiment, each of the dimensions "L" and "d" are less than about one-fourth of the operating wavelength. Because they comprise substantially parallel nanowires, each nanowire pair 104 defines its own plane. According to an embodiment, as illustrated in FIG. 1A, each of the nanowire pairs 104 is coplanar with the plane 106 and, accordingly, the nanowire pairs 104 are also coplanar with each other.

The conductive nanowires that make up the nanowire pairs 104 can be any of a variety of different cross-sectional shapes (e.g., cylindrical, square, rectangular, trapezoidal, rounded-square, rounded-rectangular, rounded-trapezoidal, hollow/shell-like versions of the above shapes, "blob-like", etc.) without departing from the scope of the present teachings. Preferably, the conductive nanowires that make up the nanowire pairs 104 comprise a highly conductive metal such as silver (Ag), gold (Au), or copper (Cu).

Figure 7:
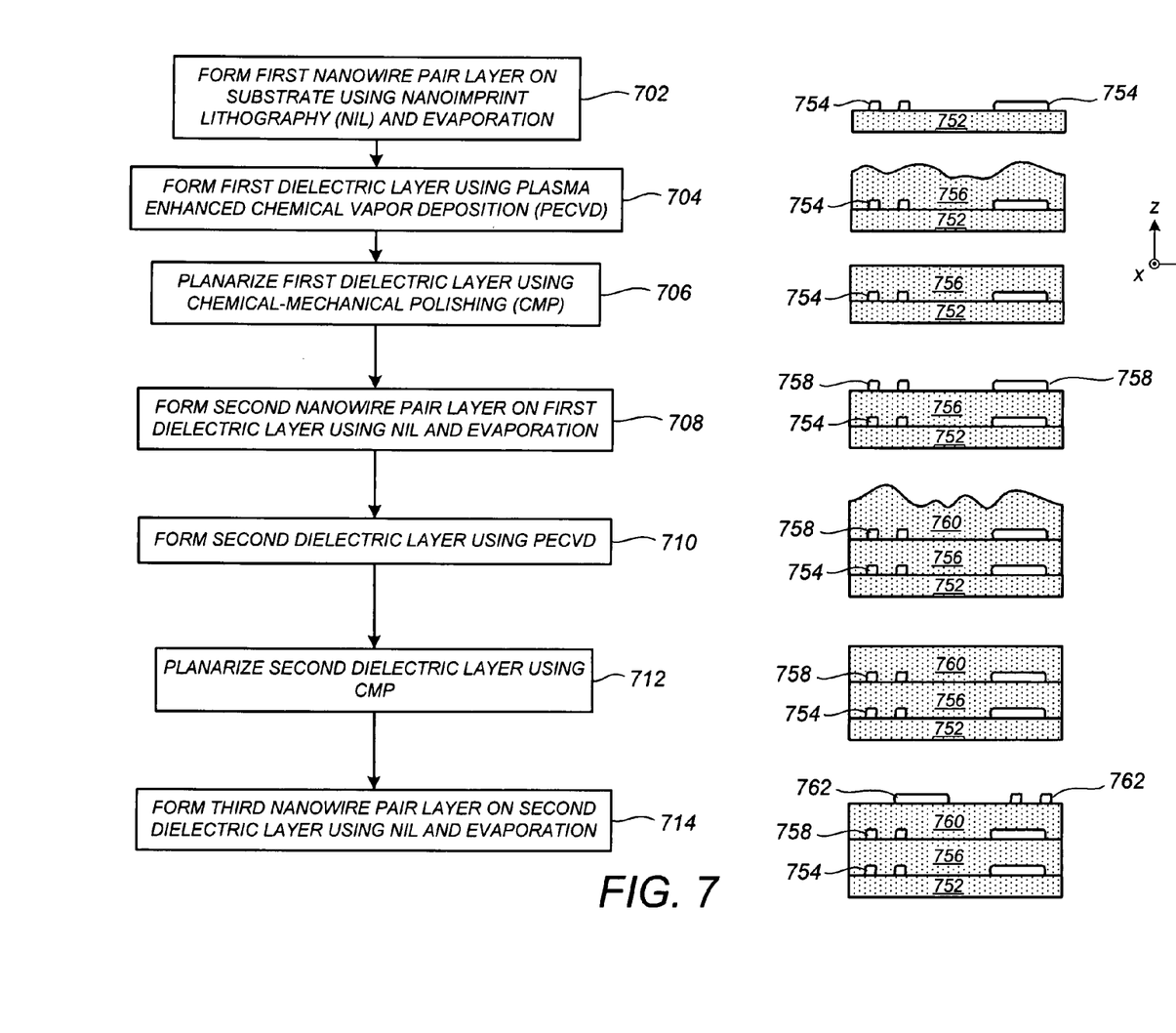
FIG. 7 illustrates fabrication of a composite material according to an embodiment.

The dielectric material surrounding/supporting the nanowire pairs 104 can be any of a variety of different dielectric materials having sufficiently low attenuation for the wavelength of operation, one suitable example being $SiO_2$, which is the exemplary dielectric material used in the fabrication scenarios of FIG. 7 and FIG. 9, infra. Other suitable examples include aluminum oxide and glass.

It is to be appreciated that although particularly advantageous for addressing one or more practical issues encountered for operation in the visible spectrum, which extends roughly from 400 nm to 700 nm, the present teachings may also be advantageous for operation in the infrared and/or microwave regimes, and therefore none of the numerical examples presented herein should be considered as limiting the scope of the embodiments to operation in the visible regime. For one embodiment applicable for at least one wavelength in the visible spectrum, one set of suitable dimensions includes a nanowire cross-sectional dimension (e.g., the distances "b" and "c" in FIG. 1B) of about 50 nm-100 nm, a separation distance "d" of about 100 nm-160 nm, a length "L" of about 100 nm-300 nm, and an inter-pair spacing of about 400-600 nm.

The nanowire pairs 104 can be characterized as forming a pattern in the plane 106 in terms of their locations and their in-plane orientations. In-plane orientation of a nanowire pair 104 refers to the longitudinal direction of each of the conductive nanowires thereof. Thus, for example, the nanowire pair 104 of FIG. 1B has an in-plane orientation along the x-axis. For one embodiment (not shown), a composite material is provided for which the nanowire pairs 104 are all patterned in a first regularly spaced array that is commonly oriented in a first direction. For another embodiment relevant to the example of FIG. 1A, a first half of the nanowire pairs 104 are patterned in a first regularly spaced array that is commonly oriented in a first direction (e.g., along the x-axis in FIG. 1A), and a second half of the nanowire pairs 104 are patterned in a second regularly spaced array that is interspersed with the first regularly spaced array and commonly oriented in a second direction substantially perpendicular to the first direction (e.g., along the y-axis in FIG. 1A).

Figure 2:
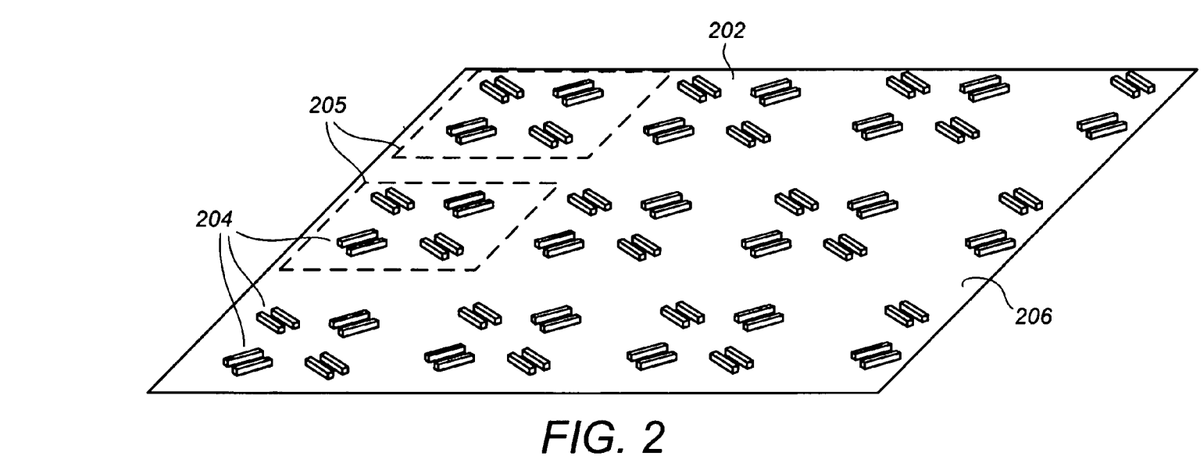
FIG. 2 illustrates a perspective view of a composite material according to an embodiment.

FIG. 2 illustrates a perspective view of a composite material 202 according to an embodiment, comprising a plurality of conductive parallel nanowire pairs 204 coplanar with a common plane 206. For this example, a first half of the nanowire pairs 204 are patterned in a first regularly spaced array that is commonly oriented in a first direction and a second half of the nanowire pairs 204 are patterned in a second regularly spaced array that is interspersed with the first regularly spaced array and commonly oriented in a second direction substantially perpendicular to the first direction. The first and second regularly spaced arrays are interspersed such that local cells 205 are formed having four nanowire pairs 204 oriented at respective 90-degree intervals.

The embodiments of FIG. 1A and FIG. 2 generally provide more isotropy than an embodiment in which all the nanowire pairs have the same in-plane orientation, particularly with respect to negative effective permittivity behavior. Generally speaking, negative effective permittivity behavior is more pronounced for electromagnetic radiation having an electric field parallel to the lengthwise direction of the conductive nanowires. For example, for electromagnetic radiation traveling in the z direction, that which is polarized with the electric field parallel to the nanowire orientation would experience the more pronounced negative effective permittivity. Accordingly, the negative effective permittivity behavior is more isotropic when the nanowire orientations are distributed in more directions.

Figure 3:
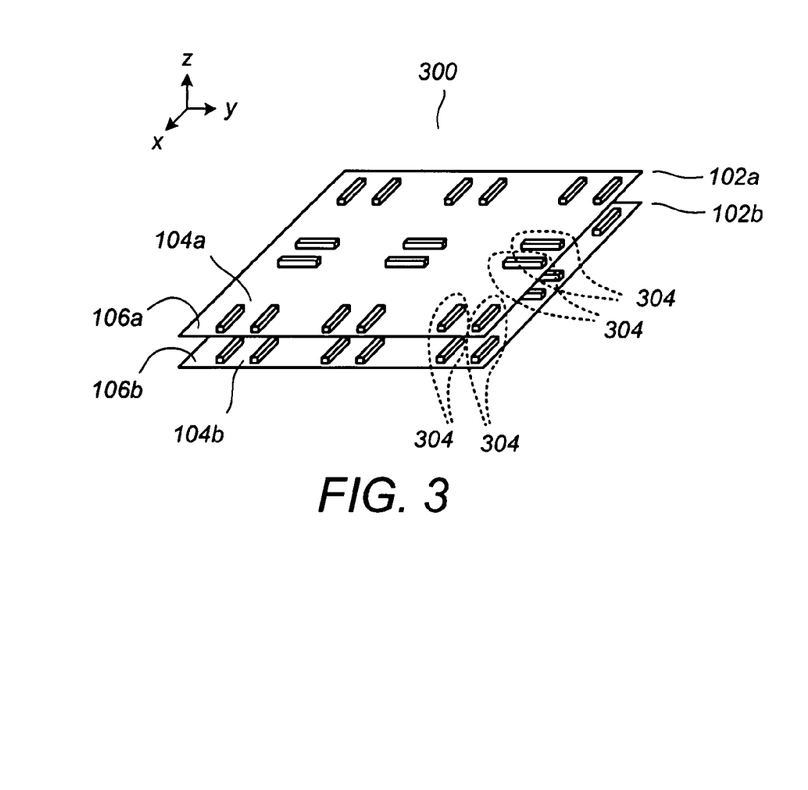
FIG. 3 illustrates a perspective view of a composite material according to an embodiment.

FIG. 3 illustrates a perspective view of a composite material 300 according to an embodiment for which isotropy is also increased with respect to negative effective permeability behavior. Composite material 300 comprises a first array 102a of conductive parallel nanowire pairs 104a coplanar with a first plane 106a and being similar to the single-plane composite material 102 of FIG. 1A. Composite material 300 further comprises a second array 102b of conductive parallel nanowire pairs 104b coplanar with a second plane 106b, wherein the second array 102b is substantially identical to the first array 102a, wherein the second array 102b is positioned in lateral registration with the first array 102a, and wherein the second plane 106b is parallel to the first plane 106a and separated therefrom by a distance not greater than twice the average separation distance of the pluralities of conductive parallel nanowire pairs 104a/104b. According to one embodiment, the separation between the planes 106a and 106b is about 130% of the average separation distance of the pluralities of conductive parallel nanowire pairs 104a/104b.

The increase in isotropy with respect to negative effective permeability behavior provided by the composite material 300 can be understood in view of the directionality of antisymmetric plasmon resonance created by any particular nanowire pair. Referring again to the conductive parallel nanowire pair 104 of FIG. 1B, antisymmetric plasmon resonances at a resonant frequency involves excitation currents of opposite directions on the respective parallel conductors of the conductive parallel nanowire pair (for example, one current flowing in the −x direction while the other flows in the +x direction). With respect to negative effective permeability behavior, this "current loop" favors coupling into magnetic field vectors that are normally oriented relative to the plane of the conductive parallel nanowire pair 104 (i.e., normal to the x-y plane in FIG. 1B). Accordingly, contribution to negative effective permeability behavior is more pronounced for electromagnetic radiation having a magnetic field vector normal to the plane of the conductive nanowire pair 104.

Referring again to FIG. 3, the proximity and registration of the first and second arrays 102a and 102b creates an entire additional dimension for the antisymmetric plasmon resonance by virtue of auxiliary parallel nanowire pairs 304 formed between individual conductive nanowires of the conductive parallel nanowire pairs 104a and 104b. Advantageously, whereas either of the planes 102a and 102b alone would favor negative effective permeability behavior only for electromagnetic radiation having magnetic field vectors in the z-direction, the composite material 300 also favors negative effective permeability behavior for electromagnetic radiation having magnetic field vectors in the x-direction and the y-direction (and, to a substantial extent, other directions in the x-y plane as well).

Figure 4:
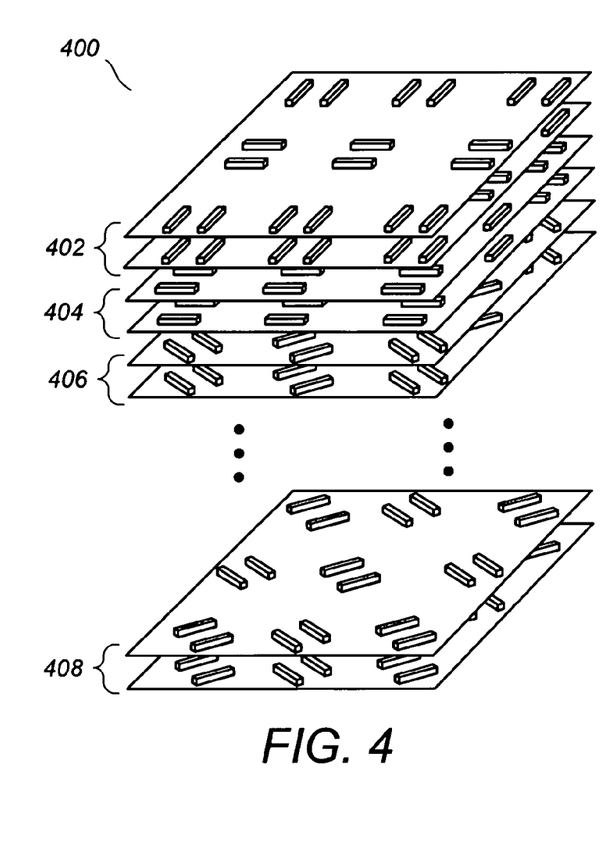
FIG. 4 illustrates a perspective view of a composite material according to an embodiment.

FIG. 4 illustrates a perspective view of a composite material 400 according to an embodiment, comprising a stack of registered array pairs 402, 404, 406, and 408. Each registered array pair 402, 404, 406, and 408 comprises two substantially identical, registered planes of conductive parallel nanowire pairs. Preferably, the respective registered array pairs 402, 404, 406, and 408 are different from each other with respect to at least one of nanowire pair location and nanowire pair orientation, for providing further improved isotropy of response for both negative effective permittivity and negative effective permeability behaviors.

For one embodiment, the number of registered array pairs that are stacked to form the composite material 400 is in the range of 2-20 pairs. For visible wavelength operation, even for 20 pairs, the overall thickness of the composite material (beyond that of a base substrate which can be of arbitrary thickness if translucent) is still only a few microns.

For one alternative embodiment applicable to any of the composite materials described hereinabove or hereinbelow, the dielectric material into which the conductive parallel nanowire pairs are disposed is selected to be at least partially dimensionally controllable according to an external control signal, for allowing external controlling of at least one optical characteristic of the composite material such as effective permeability and/or effective permittivity. Examples of such materials include polyamide and piezoelectric materials. Specifically, the dimensional control can be used to "tune" or modulate the composite material through variations in the spacings and/or orientations of the conductive nanowire pairs. For the polyamide embodiment, the overall composite material will have the physical properties of an elastic, sheet-like membrane which may open the door for a variety of useful applications.

Figure 5:
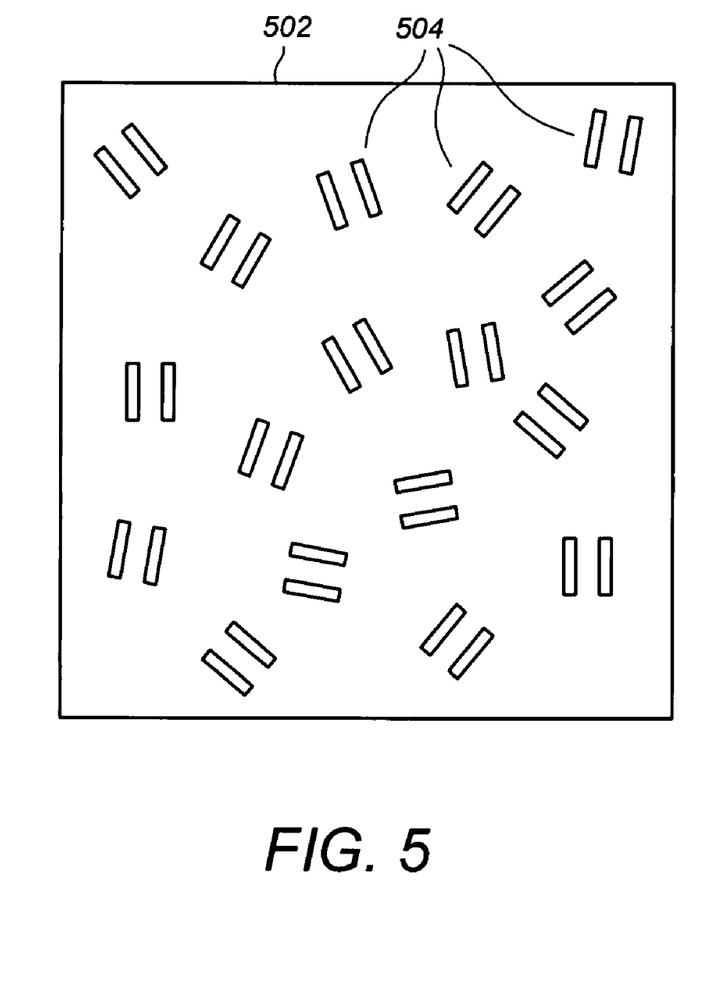
FIG. 5 illustrates a top view of a composite material according to an embodiment.

FIG. 5 illustrates a top view of a composite material 502 according to an embodiment, comprising a plurality of coplanar conductive parallel nanowire pairs 504 that are at least partially random with respect to one or both of nanowire pair location and nanowire pair orientation. Notably, for embodiments in which the composite material 502 is incorporated into stacks of registered array pairs (see FIG. 4, supra), the composite material 502 must be paired with an identical version of itself. Accordingly, the same "random" nanoimprint lithography mask (or same other "random" pattern formation method) should be used to pattern both levels of the registered array pair.

Figure 6:
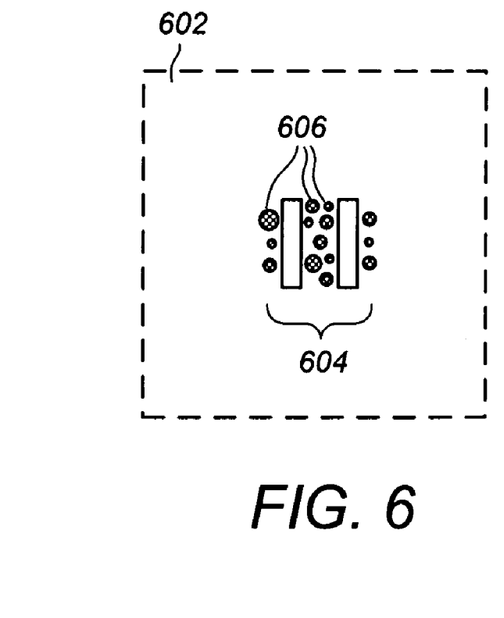
FIG. 6 illustrates a top view of a conductive parallel nanowire pair and nearby gain material according to an embodiment.

FIG. 6 illustrates a top view of a portion 602 of a composite material according to an embodiment, comprising a conductive parallel nanowire pair 604 near which a gain material, such as a plurality of quantum dots 606, is disposed. In operation, the quantum dots 606 are optically pumped by an external optical pump light source and serve to provide amplification and/or reduced attenuation as the incident electromagnetic radiation propagates through the composite material. Using known methods, the quantum dots 606 may be formed in the dielectric layer just below the nanowire pair 604 prior to the formation of the conductive parallel nanowire pair 604. The incorporation of quantum dots or other optically pumped gain material between or near conductive parallel nanowire pairs can be provided for any of the composite materials described hereinabove or hereinbelow without departing from the scope of the present teachings.

In one embodiment, the quantum dots 606 are fabricated as self-assembled structures in a III-V materials system, with examples of Group III elements including Al, Ga and In, and with examples of Group V elements being N, P, As and Sb. Thus, by way of example and not by way of limitation, the quantum dots 606 may comprise one or more of GaAs, GaN, InP, and InAs. In another embodiment, the quantum dots may comprise II-VI materials, with examples including CdSe, CdS, ZnS, ZnO, and ZnSe. In other embodiments, placement of quantum dots near conductive resonant structures may be achieved as described in the commonly assigned Ser. No. 11/285,910, filed Nov. 23, 2005, which is incorporated by reference herein. In still other embodiments, the inclusion of optically pumped gain material near conductive resonant structures may be achieved as described in the commonly assigned U.S. 2006/0044212A1, which is incorporated by reference herein.

FIG. 7 illustrates fabrication of a composite material according to an embodiment, with the desired end result being similar to the composite material 400 of FIG. 4, supra. Beginning with a dielectric substrate 752, with $SiO_2$ being used as the dielectric material, at step 702 a first horizontal nanowire pair layer comprising metallic nanowires 754 is formed using nanoimprint lithography and metal evaporation. At step 704, a first dielectric layer 756 is formed using plasma-enhanced chemical vapor deposition (PECVD). At step 706, the first dielectric layer 756 is planarized using chemical-mechanical polishing (CMP), to a level corresponding to a desired vertical spacing between two registered nanowire planes. Notably, for an alternative embodiment in which polyamide is used as the dielectric material, the dielectric layer formation step 704 would use spin-coating rather than PECVD and the planarization step 706 would use mechanical pressing rather than CMP.

At step 708, a second nanowire pair layer is formed comprising metal nanowires 758 using nanoimprint lithography and metal evaporation, with the same nanoimprint lithography mold from step 702 being used for achieving precise registration of the metal nanowires 758 with the metal nanowires 754. At step 710 a second dielectric layer 760 is formed using PECVD, and at step 712 the second dielectric layer 760 is planarized to a level corresponding to a desired spacing between non-registered nanowire planes, which may be the same as or different than the desired spacing between two registered nanowire planes. At step 708, a third nanowire pair layer is formed comprising metal nanowires 762 using nanoimprint lithography and metal evaporation, with a different nanoimprint lithography mold (or translated/rotated version) than was used in steps 702 and 708, for achieving a different nanowire pattern. The steps 702-714 are repeated until the desired number of planes has been achieved.

Figure 8A:
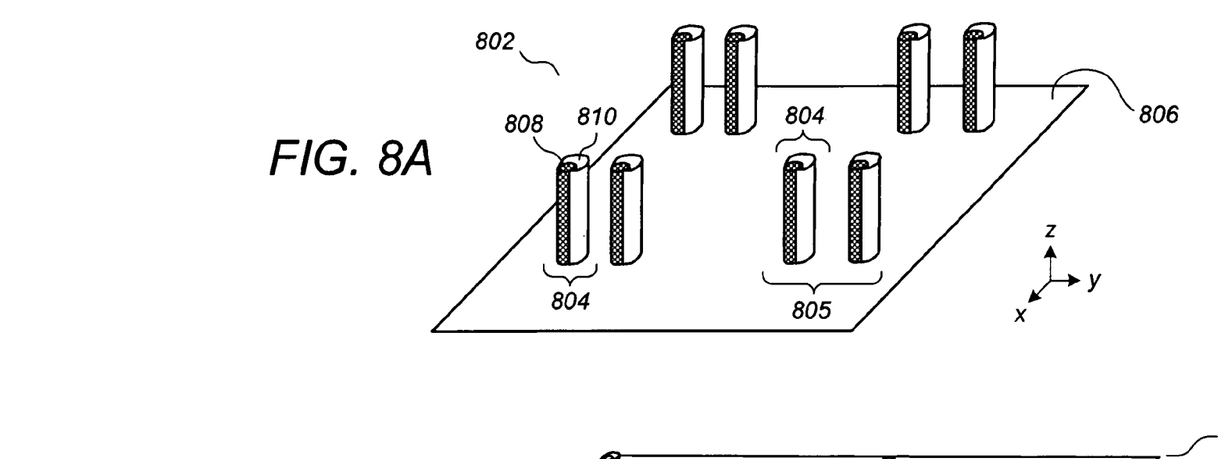
FIG. 8A illustrates a perspective view of a composite material according to an embodiment.

FIG. 8A illustrates a perspective view of a composite material 802 according to an embodiment, comprising a dielectric layer (not shown) generally parallel to a plane 806, and further comprising and plurality of conductive nanowires 804 distributed across the dielectric layer. Each conductive nanowire 804 is generally normal to the plane 806 and is of short length relative to the operating wavelength. According to an embodiment, each of the conductive nanowires 804 comprises a columnar core 808 that includes an optically pumped gain material and a semi-cylindrical metal layer 810 coated on one side of the core 808. The other side of the core 808 remains exposed (or, more specifically, abuts the surrounding dielectric material directly without metal in the way). Advantageously, the semi-cylindrical metal layer 810 provides longitudinal conductivity for promoting negative effective permittivity behavior for electromagnetic radiation having an electric field vector normal to the plane 806. At the same time, the exposed side of the core 804 allows for externally applied optical pump light to optically pump the gain material in the core 804, for providing amplification and/or reduced attenuation for the propagating optical signal.

For the particular embodiment shown in FIG. 8A, the conductive nanowires 804 are arranged into vertically extending conductive parallel nanowire pairs 805, for also advantageously promoting negative effective permeability behavior for electromagnetic radiation having a magnetic field vector parallel to the plane 806 in the x-direction. In another embodiment (not shown), the conductive nanowires 804 stand alone (not in pairs) and are regularly distributed across the plane 806 in a periodic manner. In yet another embodiment (not shown), the conductive nanowires 804 stand alone (not in pairs) and are randomly distributed across the plane 806.

Figure 8B:
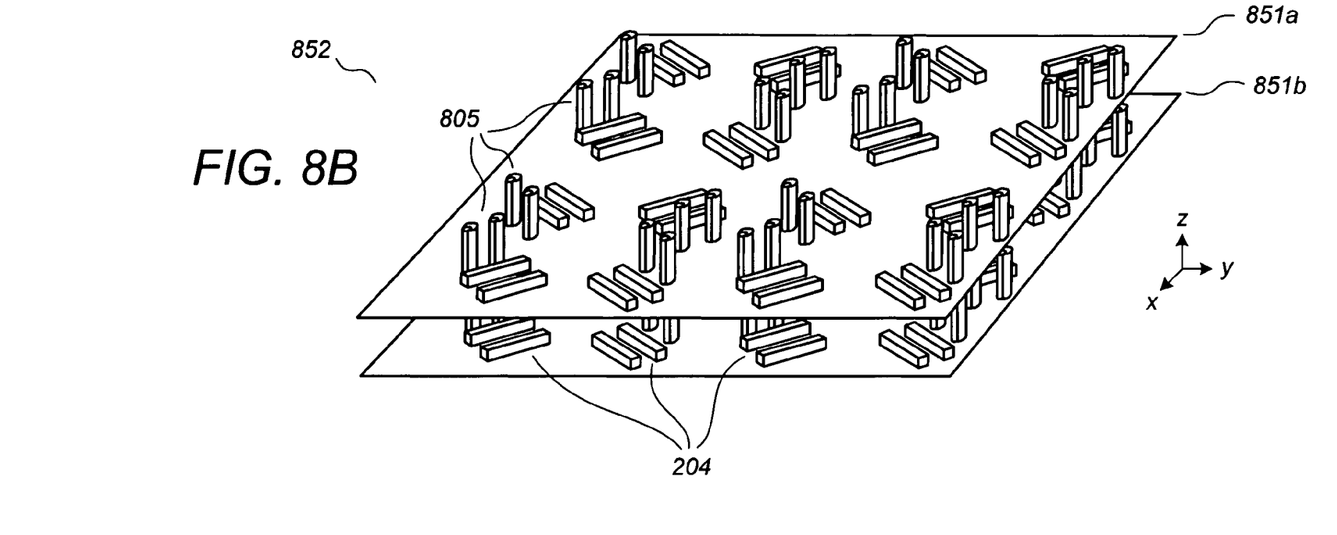
FIG. 8B illustrates a perspective view of a composite material according to an embodiment.

FIG. 8B illustrates a perspective view of a composite material 852 according to an embodiment, comprising a pair of substantially identical arrays 851a and 851b in close proximity (e.g., separated by substantially less than a wavelength) and in registration with each other. Each of the arrays 851a and 851b comprises a combination of the vertically extending conductive parallel nanowire pairs 805 from FIG. 8A and the horizontal, coplanar conductive parallel nanowire pairs 204 from FIG. 2, supra, arranged in what can be termed a quadratic symmetry. The composite material 852 advantageously provides for increased isotropy in the form of (a) promoting negative effective permittivity behavior for electromagnetic radiation having electric field vectors either normal to the x-y plane or parallel to the x-y plane, and (b) promoting negative effective permeability behavior for electromagnetic radiation having magnetic field vectors either normal to the x-y plane or parallel to the x-y plane. The composite material 852 also advantageously provides for amplification and/or reduced attenuation for the propagating optical signal. In another embodiment (not shown) analogous in purpose to the composite material 400 of FIG. 4, supra, multiple such sets of registered array pairs are stacked on top of each other.

FIG. 9 illustrates fabrication of a composite material according to an embodiment, with the desired end result being several stacked sets of registered array pairs, each being similar to the composite material 852 of FIG. 8B, and with the gain material feature of FIG. 6, supra, being incorporated. Beginning with a dielectric substrate 952, with SiO$_2$ being used as the dielectric material, at step 902 a vertical nanowire pair sublayer is formed comprising core nanowires 954 using nanoimprint lithography and catalytic nanowire growth including gain material.

More particularly, for step 902, catalyst islands comprising small amounts of catalyst material (such as gold, cobalt, nickel, titanium, or other suitable metal) are deposited on the substrate 952 according to a nanoimprint lithography process. Using a nanoimprint lithography-based process provides for relatively precise placement of the catalyst islands according to a desired predetermined array pattern, and has an additional advantage of being fast and scalable for mass production. In one embodiment, the protrusions of a nanoimprinting mold are coated with the catalyst material, the protrusions forming the desired predetermined array pattern, and the catalyst material is transferred to the substrate 952 in the desired predetermined array pattern by pressing the mold against the substrate 952. The catalyst material is transferred to the substrate 952 by at least one of physical contact, energetic attraction, or chemical attraction. In another embodiment, the protrusions of the mold can be geometrically tailored according to a desired geometrical footprint for the desired nanostructures. Notably, a variety of other methods for depositing the catalyst islands with the desired shape and spatial configuration onto the substrate 952 are within the scope of the present teachings. Examples include methods described in the commonly assigned U.S. 2004/0082178A1, which is incorporated by reference herein.

Further to step 902, the incorporation of optically pumped gain material into the core nanowires 904 can be achieved in various ways without departing from the scope of the present teachings. The gain material can comprise ZnO, InP, GaAs or other III-V semiconductor materials known to be able to provide gain when optically pumped. For one embodiment, multiple quantum wells (MQW) are formed according to a InGaAsP/InGaAs/InP material system or a different material system suitable for the wavelengths of interest. For one embodiment, a thin core nanowire is catalytically grown comprising a first MQW layer, and then subsequent MQW layers are grown conformally therearound (and upwardly at the very top) from that first MQW layer. For another embodiment, the MQW layers can be directly formed vertically into the core nanowire during the catalytic growth process by introducing the proper temperature, pressure, and chemical vapor variations at the proper times into the catalytic growth process, as could be determined experimentally by a person skilled in the art in view of the present disclosure without undue experimentation.

At step 904, a semi-cylindrical metal layer 956 is formed on one side of each core nanowire 954 using, for example, a directional e-beam evaporation process that is represented by the vapor and arrow symbols at element 955 in FIG. 9. It is to be appreciated that the semi-cylindrical metal layer 956 can take on many different inner and outer cross-sectional shapes depending on the particular columnar cross-section of the core nanowire 954, including many odd shapes, and that the term semi-cylindrical metal layer is used generically to describe the result of such one-sided coating process of step 904 even for such various cross-sectional shapes.

At step 906, a first dielectric sublayer 958 is formed using plasma-enhanced chemical vapor deposition (PECVD). At step 908, the first dielectric sublayer 958 is planarized using chemical-mechanical polishing (CMP), to a level corresponding to a desired height of the core nanowires 904 with their semi-cylindrical metal layers 956. At step 910, one or more layers of quantum dots 960 are formed at locations near the future horizontal conductive nanowires, beginning with the deposition of a very thin (10 nm) polysilicon layer, using known methods. Generally speaking, the overall height of the quantum dots 960 will be minimal, perhaps a few tens of nanometers, such that a dielectric filling/planarization step is not necessary prior to formation of the horizontal conductive nanowires, although such step (not shown) could optionally be performed immediately after step 910.

At step 912 a horizontal nanowire pair sublayer comprising horizontal conductive nanowires 962 is formed using nanoimprint lithography and metal evaporation. At step 914, a second dielectric sublayer 964 is formed using PECVD, and at step 916 the second dielectric sublayer 964 is planarized using CMP to a level corresponding to a desired distance between the horizontal conductive nanowires 962 and a proximal end of the vertical conductive nanowires in the next overall level. At the end of step 916, a complete first overall layer 965 has been formed and, essentially, the process is then repeated taking into account the desire to have registration between adjacent pairs of levels. Thus, more particularly, at step 918 the steps 902-908 are repeated to form a first dielectric sublayer 970 of a second overall layer 977 including the core nanowires 966 with their semi-cylindrical metal layers 968, and at step 920 the steps 910-916 are repeated to form a second dielectric sublayer 976 of the second overall layer 977 including the quantum dots 972 and horizontal conductive nanowires 974, thereby completing the second overall layer 977. At step 922, the steps 902-916 are again repeated to form a first dielectric sublayer 982 of a third overall layer 989 including the core nanowires 978 with their semi-cylindrical metal layers 980 and a second dielectric sublayer 988 of the third overall layer 989 including the quantum dots 984 and horizontal conductive nanowires 986, except that the vertical and horizontal conductive nanowires 978/986 of the third overall layer 989 are not registered with the vertical and horizontal conductive nanowires 966/962 of the second overall layer 977 and will instead be registered with the next (fourth) overall level. The steps 902-916 are repeated until the desired number of overall levels has been achieved.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, other metallic conductor shapes may be incorporated into the plane of the coplanar conductive parallel nanowire pairs, or into a nearby plane, such as lengthier conductor elements for further enhancing negative effective permeability behavior, without departing from the scope of the present teachings. Thus, reference to the details of the described embodiments are not intended to limit their scope.

What is claimed is:

1. A composite material exhibiting at least one of a negative effective permittivity and a negative effective permeability for incident radiation at an operating wavelength, comprising:
    a dielectric layer generally parallel to a dielectric layer plane; and
    a first plurality of nanowire pairs disposed in said dielectric layer, each of said first plurality of nanowire pairs comprising substantially parallel conductive nanowires of short length and separation relative to said operating wavelength;
    wherein each of said first plurality of nanowire pairs is substantially coplanar with a first plane substantially parallel to said dielectric layer plane, and said first plurality of nanowire pairs forms a first pattern within said first plane characterized by nanowire pair locations and nanowire pair orientations within said first plane, and wherein said first pattern comprises a first regularly-spaced array of commonly oriented nanowire pairs and forms a second regularly-spaced array of nanowire pairs that is interspersed with said first regularly-spaced array of nanowire pairs and commonly oriented in a direction substantially perpendicular to said first regularly-spaced array of nanowire pairs.

2. The composite material of claim 1, said first plurality of nanowire pairs forming a first pattern in said first plane, further comprising:
    a second plurality of nanowire pairs substantially identical to said first plurality of nanowire pairs and forming a second pattern in a second plane substantially parallel to said first plane;
    wherein said second pattern is substantially identical to said first pattern and in registration therewith; and
    wherein said first and second planes are separated by a first distance not greater than twice an average separation of the paired conductive nanowires in said first plurality of nanowires.

3. The composite material of claim 2, said first pattern being characterized by nanowire pair locations and nanowire pair orientations within said first plane, further comprising:
    third and fourth pluralities of parallel conductive nanowire pairs substantially identical to each other and forming identical third and fourth patterns in third and fourth planes, respectively, said third and fourth planes being substantially parallel to each other and to said first plane;
    wherein said third and fourth planes are separated by a second distance not greater than twice an average separation of the paired parallel conductive nanowires therein; and
    wherein said third pattern is substantially different than said first pattern with respect to at least one of said nanowire pair locations and nanowire pair orientations.

4. The composite material of claim 1, further comprising an optically pumped gain material positioned near each of said first plurality of nanowire pairs.

5. The composite material of claim 1, wherein said operating wavelength is a visible wavelength, and wherein each of said length and separation of said parallel conductive nanowires is less than one-fourth of said operating wavelength.

6. The composite material of claim 1, wherein said dielectric layer comprises a material that is at least partially dimensionally controllable according to an external control signal for externally controlling at least one optical characteristic of the composite material.

7. The composite material of claim 1, wherein said material comprises at least one of polyamide and a piezoelectric material.

8. The composite material of claim 1, further comprising a second plurality of nanowire pairs each comprising substantially parallel conductive nanowires of short length and separation relative to said operating wavelength, wherein all of said second plurality of nanowire pairs are substantially perpendicular to said dielectric layer plane and distributed laterally across a second plane substantially parallel to said first plane at locations respectively associated with said first plurality of nanowire pairs.

9. The composite material of claim 8, wherein said second plurality of nanowire pairs each comprise a columnar core including an optically pumped gain material and a semi-cylindrical metal layer coated on one side of the core, whereby the semi-cylindrical metal layer provides longitudinal electrical conductivity while a non-coated side of the core provides for access to the gain material by externally applied optical pump light.

10. A composite material exhibiting at least one of a negative effective permittivity and a negative effective permeability for incident radiation at an operating wavelength, comprising:
a first dielectric layer generally parallel to a first plane; and
a first plurality of nanowires distributed across said first dielectric layer, each of said first plurality of nanowires being generally normal to said first plane and being of short length relative to said operating wavelength;
wherein each of said first plurality of nanowires comprises a columnar core including an optically pumped gain material and a semi-cylindrical metal layer coated on one side of the core, whereby the semi-cylindrical metal layer provides longitudinal conductivity while a non-coated side of the core provides for access to the gain material by externally applied optical pump light.

11. The composite material of claim 10, wherein said gain material is grown into said core in conjunction with a catalytic nanowire growth process, and
wherein said semi-cylindrical metal layer is formed by a directional metal evaporation process subsequent to said catalytic nanowire growth of said core.

12. The composite material of claim 10, wherein said first plurality of nanowires is laterally arranged across said first dielectric layer to form a first plurality of conductive parallel nanowire pairs each having a separation distance substantially shorter than said operating wavelength, the composite material further comprising a second plurality of conductive parallel nanowire pairs of short length and separation relative to said operating wavelength, each of said second plurality of conductive parallel nanowire pairs being substantially coplanar with a second plane substantially parallel to said first plane.

13. The composite material of claim 12, wherein said second plurality of conductive parallel nanowires is contained in a second dielectric layer adjacent to said first dielectric layer and parallel thereto, and wherein proximal ends of said first plurality of conductive parallel nanowire pairs are separated from said second plane by a distance substantially less than said operating wavelength.

14. The composite material of claim 10, wherein said dielectric layer comprises a material that is at least partially dimensionally controllable according to an external control signal for externally controlling at least one optical characteristic of the composite material.

15. A composite material exhibiting at least one of a negative effective permittivity and a negative effective permeability for incident radiation at an operating wavelength, comprising;
a dielectric layer generally parallel to a dielectric layer plane; and
a first plurality of nanowire pairs disposed in said dielectric layer, each of said first plurality of nanowire pairs comprising substantially parallel conductive nanowires of short length and separation relative to said operating wavelength;
wherein each of said first plurality of nanowire pairs is substantially coplanar with a first plane substantially parallel to said dielectric layer plane, and said first plurality of nanowire pairs forms a first pattern within said first plane that is at least partially random with respect to at least one of nanowire pair location and nanowire pair orientation.

16. The composite material of claim 15, said first plurality of nanowire pairs forming a first pattern in said first plane, further comprising:
a second plurality of nanowire pairs substantially identical to said first plurality of nanowire pairs and forming a second pattern in a second plane substantially parallel to said first plane;
wherein said second pattern is substantially identical to said first pattern and in registration therewith; and
wherein said first and second planes are separated by a first distance not greater than twice an average separation of the paired conductive nanowires in said first plurality of nanowires.

17. The composite material of claim 16, said first pattern being characterized by nanowire pair locations and nanowire pair orientations within said first plane, further comprising:
third and fourth pluralities of parallel conductive nanowire pairs substantially identical to each other and forming identical third and fourth patterns in third and fourth planes, respectively, said third and fourth planes being substantially parallel to each other and to said first plane;
wherein said third and fourth planes are separated by a second distance not greater than twice an average separation of the paired parallel conductive nanowires therein; and
wherein said third pattern is substantially different than said first pattern with respect to at least one of said nanowire pair locations and nanowire pair orientations.

18. The composite material of claim 15, further comprising an optically pumped gain material positioned near each of said first plurality of nanowire pairs.

19. The composite material of claim 15, wherein said operating wavelength is a visible wavelength, and wherein each of said length and separation of said parallel conductive nanowires is less than one-fourth of said operating wavelength.

20. The composite material of claim 15, wherein said dielectric layer comprises a material that is at least partially dimensionally controllable according to an external control signal for externally controlling at least one optical characteristic of the composite material.

21. The composite material Qf claim 15, wherein said material comprises at least one of polyamide and a piezoelectric material.

22. The composite material of claim 15, further comprising a second plurality of nanowire pairs each comprising substantially parallel conductive nanowires of short length and separation relative to said operating wavelength, wherein all of said second plurality of nanowire pairs are substantially perpendicular to said dielectric layer plane and distributed laterally across a second plane substantially parallel to said first plane at locations respectively associated with said first plurality of nanowire pairs.

23. The composite material of claim 22, wherein said second plurality of nanowire pairs each comprise a columnar core including an optically pumped gain material and a semi-cylindrical metal layer coated on one side of the core, whereby the semi-cylindrical metal layer provides longitudinal electrical conductivity while a non-coated side of the core provides for access to the gain material by externally applied optical pump light.

* * * * *

UNITED STATES PATENT AND TRADEMARK OFFICE
CERTIFICATE OF CORRECTION

PATENT NO. : 7,482,727 B2
APPLICATION NO. : 11/580641
DATED : January 27, 2009
INVENTOR(S) : Alexandre Bratkovski et al.

It is certified that error appears in the above-identified patent and that said Letters Patent is hereby corrected as shown below:

In column 11, lines 52-53, in Claim 15, delete "comprising;" and insert -- comprising: --, therefor.

In column 12, line 44, in Claim 21, delete "Qf" and insert -- of --, therefor.

Signed and Sealed this

Fourteenth Day of July, 2009

JOHN DOLL
*Acting Director of the United States Patent and Trademark Office*